(12) United States Patent
Koyama

(10) Patent No.: US 11,259,401 B2
(45) Date of Patent: Feb. 22, 2022

(54) RESIN MULTILAYER SUBSTRATE, ELECTRONIC COMPONENT, AND MOUNTING STRUCTURE THEREOF

(71) Applicant: Murata Manufacturing Co., Ltd., Nagaokakyo (JP)

(72) Inventor: Hiromasa Koyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/865,457

(22) Filed: May 4, 2020

(65) Prior Publication Data
US 2020/0267831 A1    Aug. 20, 2020

Related U.S. Application Data

(63) Continuation of application No. PCT/JP2018/040299, filed on Oct. 30, 2018.

(30) Foreign Application Priority Data

Nov. 16, 2017    (JP) .............................. JP2017-221046

(51) Int. Cl.
*H05K 1/00*    (2006.01)
*H05K 1/02*    (2006.01)
(Continued)

(52) U.S. Cl.
CPC .......... *H05K 1/0225* (2013.01); *H05K 1/0219* (2013.01); *H01R 12/57* (2013.01);
(Continued)

(58) Field of Classification Search
CPC .. H05K 1/00; H05K 1/02; H05K 1/03; H05K 1/09; H05K 1/11; H05K 1/14; H05K 1/16;
(Continued)

(56) References Cited

U.S. PATENT DOCUMENTS 5,374,469 A * 12/1994 Hino ...................... H05K 1/036
428/209
5,438,223 A * 8/1995 Higashi ............. H01L 23/49827
257/774
(Continued)

FOREIGN PATENT DOCUMENTS

JP    10-335535 A    12/1998
JP    2002-324979 A    11/2002
(Continued)

OTHER PUBLICATIONS

Official Communication issued in International Patent Application No. PCT/JP2018/040299, dated Dec. 25, 2018.

*Primary Examiner* — Xiaoliang Chen
(74) *Attorney, Agent, or Firm* — Keating & Bennett, LLP

(57) ABSTRACT

A resin multilayer substrate includes a plurality of insulating resin base material layers and a plurality of conductor patterns provided on the plurality of insulating resin base material layers. The plurality of conductor patterns include a signal line and a ground conductor overlapping the signal line as viewed from a laminating direction of the insulating resin base material layers. A plurality of openings are provided in the ground conductor, and an aperture ratio is higher in a zone far from the signal line than in a zone adjacent to or in a vicinity of the signal line in a direction perpendicular or substantially perpendicular to the laminating direction.

16 Claims, 13 Drawing Sheets

(51) Int. Cl.
| | |
|---|---|
| *H05K 1/03* | (2006.01) |
| *H05K 1/09* | (2006.01) |
| *H05K 1/11* | (2006.01) |
| *H05K 1/14* | (2006.01) |
| *H05K 1/16* | (2006.01) |
| *H05K 1/18* | (2006.01) |
| *H05K 3/00* | (2006.01) |
| *H05K 3/06* | (2006.01) |
| *H05K 3/10* | (2006.01) |
| *H05K 3/18* | (2006.01) |
| *H05K 3/20* | (2006.01) |
| *H05K 3/22* | (2006.01) |
| *H05K 3/26* | (2006.01) |
| *H05K 3/28* | (2006.01) |
| *H05K 3/32* | (2006.01) |
| *H05K 3/40* | (2006.01) |
| *H05K 3/42* | (2006.01) |
| *H05K 3/44* | (2006.01) |
| *H05K 3/46* | (2006.01) |
| *H01L 23/00* | (2006.01) |
| *H01L 23/02* | (2006.01) |
| *H01L 23/12* | (2006.01) |
| *H01L 23/14* | (2006.01) |
| *H01L 23/48* | (2006.01) |
| *H01L 23/50* | (2006.01) |
| *H01L 23/66* | (2006.01) |
| *H01L 23/498* | (2006.01) |
| *H01L 23/552* | (2006.01) |
| *H01R 12/57* | (2011.01) |

(52) U.S. Cl.
CPC .......... *H05K 2201/0723* (2013.01); *H05K 2201/096* (2013.01); *H05K 2201/0969* (2013.01); *H05K 2201/0979* (2013.01); *H05K 2201/09354* (2013.01); *H05K 2201/09609* (2013.01)

(58) Field of Classification Search
CPC ...... H05K 1/18; H05K 1/0219; H05K 1/0225; H05K 3/00; H05K 3/06; H05K 3/10; H05K 3/18; H05K 3/20; H05K 3/22; H05K 3/26; H05K 3/28; H05K 3/32; H05K 3/40; H05K 3/42; H05K 3/44; H05K 3/46; H01L 23/00; H01L 23/02; H01L 23/12; H01L 23/14; H01L 23/48; H01L 23/50; H01L 23/66; H01L 23/498; H01L 23/552
USPC .............. 361/784, 764, 767, 777, 782, 792; 174/252, 254–264, 266; 428/137, 198, 428/209, 212, 473.5, 544, 596
See application file for complete search history.

(56) References Cited

U.S. PATENT DOCUMENTS

| | | | | |
|---|---|---|---|---|
| 5,451,721 A * | 9/1995 | Tsukada | | H05K 1/0265 174/261 |
| 5,571,608 A * | 11/1996 | Swamy | | H05K 1/0287 174/255 |
| 5,662,816 A * | 9/1997 | Andry | | H01P 3/081 216/18 |
| 6,106,923 A | 8/2000 | Takahashi et al. | | |
| 6,197,407 B1 * | 3/2001 | Andou | | H05K 3/20 174/255 |
| 6,214,445 B1 * | 4/2001 | Kanbe | | H01L 23/49822 174/250 |
| 6,323,439 B1 * | 11/2001 | Kambe | | H05K 3/0038 174/255 |
| 6,333,857 B1 * | 12/2001 | Kanbe | | H01L 23/49822 174/262 |
| 6,621,154 B1 * | 9/2003 | Satoh | | C08L 63/00 257/40 |
| 9,232,653 B2 * | 1/2016 | Shiozaki | | H05K 1/115 |
| 2001/0005545 A1 * | 6/2001 | Andou | | H05K 3/20 428/209 |
| 2002/0153611 A1 * | 10/2002 | Nakanishi | | H05K 1/0224 257/758 |
| 2003/0011070 A1 * | 1/2003 | Iijima | | H05K 3/445 257/734 |
| 2003/0128532 A1 * | 7/2003 | Somei | | H01Q 1/38 361/777 |
| 2003/0174479 A1 * | 9/2003 | Shimura | | H01L 23/66 361/764 |
| 2004/0018373 A1 * | 1/2004 | Suzuki | | H05K 3/0052 428/596 |
| 2005/0205294 A1 * | 9/2005 | Yamashita | | H05K 3/386 174/255 |
| 2006/0202322 A1 * | 9/2006 | Kariya | | H01L 23/49827 257/698 |
| 2006/0281297 A1 * | 12/2006 | Ogawa | | H01L 23/5389 438/622 |
| 2007/0029106 A1 * | 2/2007 | Kato | | H01L 23/49838 174/255 |
| 2007/0029667 A1 * | 2/2007 | Fujii | | H01Q 23/00 257/723 |
| 2007/0108591 A1 * | 5/2007 | Sunohara | | H01L 21/486 257/700 |
| 2007/0222052 A1 * | 9/2007 | Kabumoto | | H05K 1/0224 257/679 |
| 2007/0297157 A1 * | 12/2007 | Tanaka | | H01L 23/50 361/766 |
| 2008/0017407 A1 * | 1/2008 | Kawano | | H05K 1/162 174/260 |
| 2008/0197501 A1 * | 8/2008 | Imanaka | | H01L 23/49822 257/758 |
| 2009/0183899 A1 * | 7/2009 | Ishida | | H05K 3/3447 174/252 |
| 2009/0290316 A1 * | 11/2009 | Kariya | | H01L 23/50 361/767 |
| 2010/0181558 A1 * | 7/2010 | Yamashita | | B82Y 10/00 257/40 |
| 2012/0138340 A1 | 6/2012 | Kato et al. | | |
| 2013/0069251 A1 * | 3/2013 | Kunimoto | | H05K 1/0298 257/784 |
| 2015/0130659 A1 * | 5/2015 | Mori | | G01S 7/20 342/175 |
| 2015/0351251 A1 * | 12/2015 | Hirose | | H05K 3/0088 134/1 |
| 2016/0017498 A1 * | 1/2016 | Laitar | | C23C 18/40 427/97.7 |
| 2016/0073495 A1 * | 3/2016 | Happoya | | H05K 1/0281 174/254 |
| 2016/0174364 A1 * | 6/2016 | Harkness, Jr. | | H05K 1/111 174/257 |
| 2016/0199887 A1 * | 7/2016 | Takezoe | | B08B 3/123 134/1 |
| 2017/0012008 A1 * | 1/2017 | Yasooka | | H01L 23/49838 |
| 2017/0054217 A1 * | 2/2017 | Hashimoto | | H01Q 13/10 |
| 2017/0167970 A1 * | 6/2017 | Wang | | G01H 9/004 |
| 2017/0373020 A1 * | 12/2017 | Sasaki | | H01L 24/83 |
| 2018/0002541 A1 * | 1/2018 | Rietmann | | C09D 5/44 |
| 2018/0158752 A1 * | 6/2018 | Choi | | H01L 23/3677 |
| 2018/0184516 A1 * | 6/2018 | Kashiwakura | | H05K 1/185 |
| 2018/0184522 A1 * | 6/2018 | Rodriguez | | H01L 23/49827 |
| 2018/0209048 A1 * | 7/2018 | Qi | | C09D 1/00 |
| 2018/0211750 A1 * | 7/2018 | Wang | | H05K 1/165 |
| 2018/0235076 A1 * | 8/2018 | Kashiwakura | | H05K 1/0243 |

(56) References Cited

U.S. PATENT DOCUMENTS

2019/0162778 A1\* 5/2019 Kanematsu ........ G01R 31/2884
2019/0245275 A1\* 8/2019 Hayashi ................... H01Q 5/42

FOREIGN PATENT DOCUMENTS

| JP | 2005-136347 A | 5/2005 |
| JP | 2005-353835 A | 12/2005 |
| JP | 2006-024618 A | 1/2006 |
| JP | 2009-302506 A | 12/2009 |
| JP | 2011-066293 A | 3/2011 |
| WO | 2011/018979 A1 | 2/2011 |

\* cited by examiner

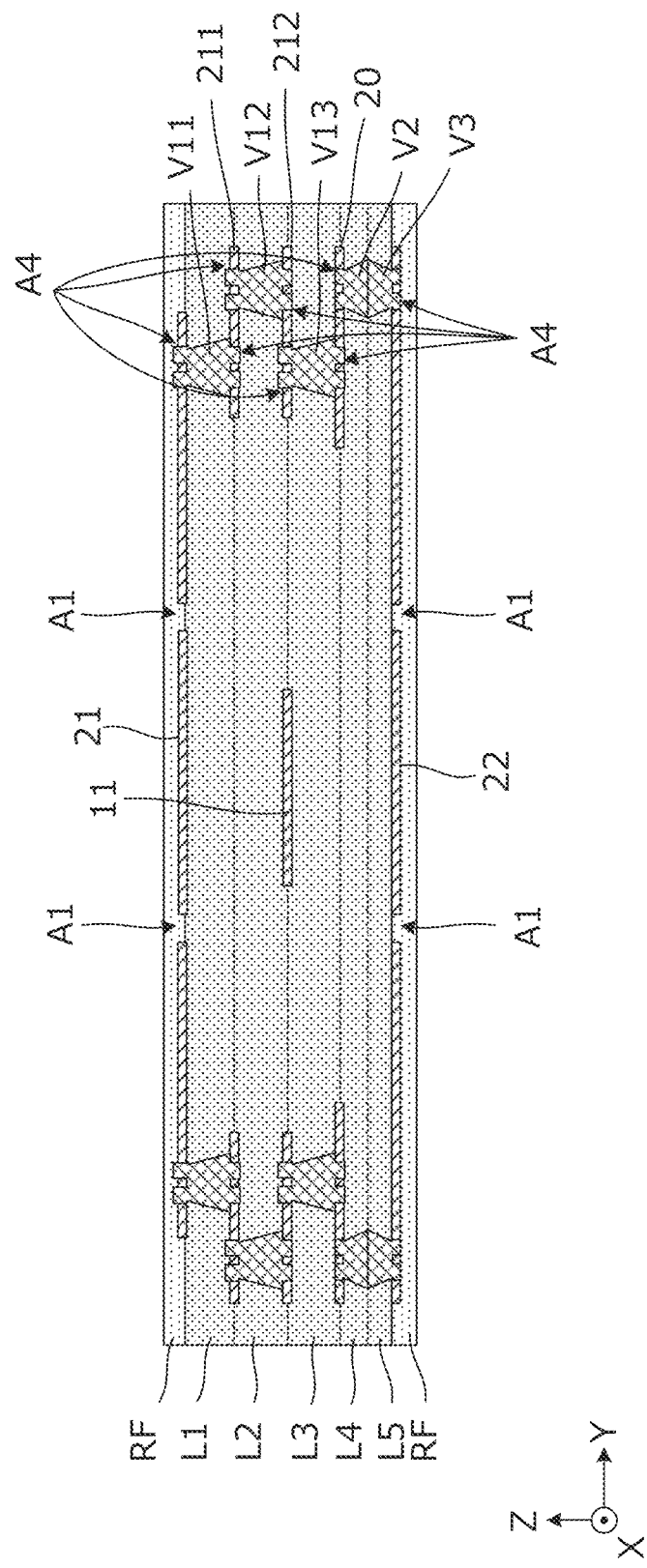

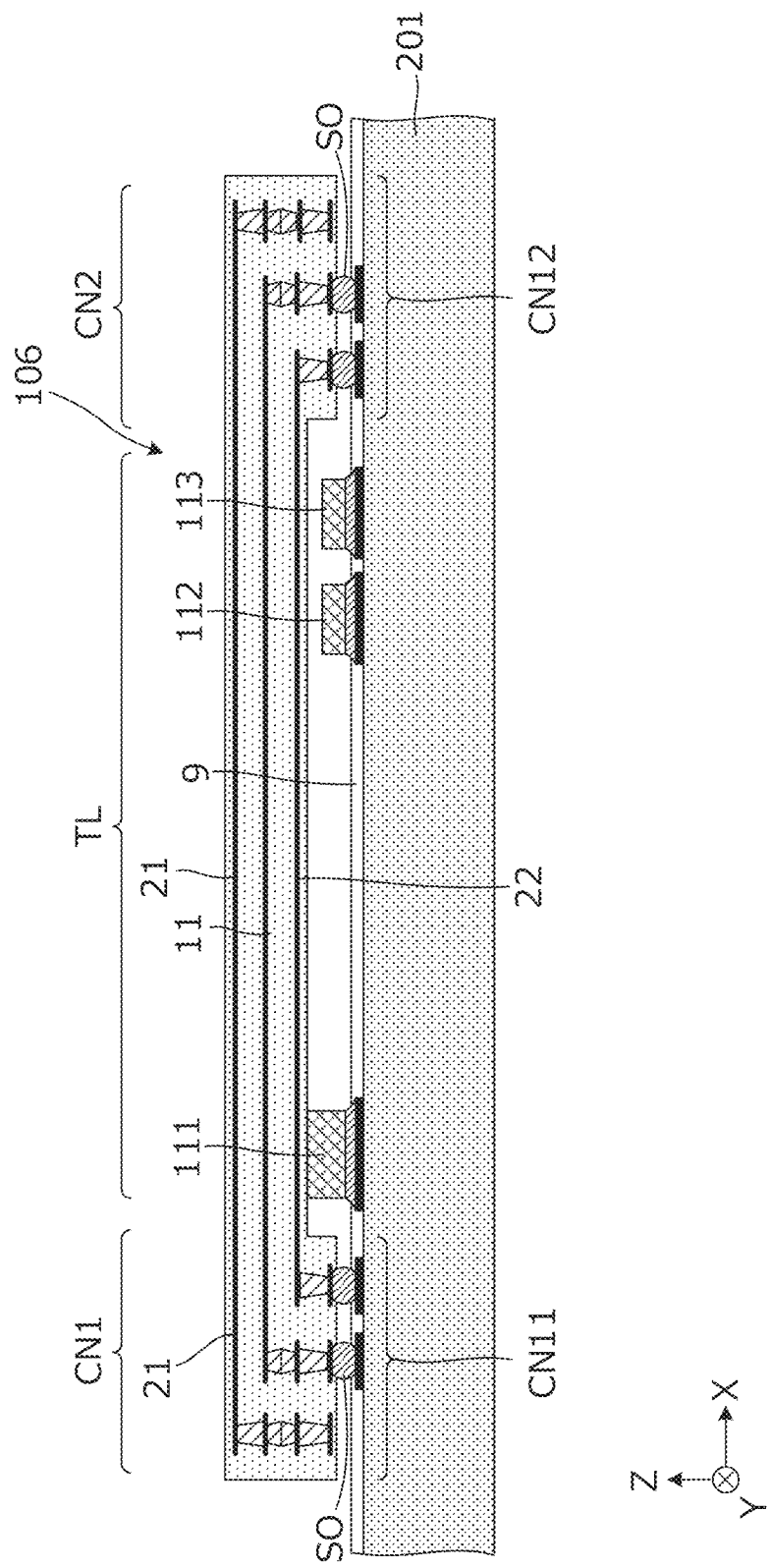

RESIN MULTILAYER SUBSTRATE, ELECTRONIC COMPONENT, AND MOUNTING STRUCTURE THEREOF

CROSS REFERENCE TO RELATED APPLICATIONS

This application claims the benefit of priority to Japanese Patent Application No. 2017-221046 filed on Nov. 16, 2017 and is a Continuation Application of PCT Application No. PCT/JP2018/040299 filed on Oct. 30, 2018. The entire contents of each application are hereby incorporated herein by reference.

BACKGROUND OF THE INVENTION

1. Field of the Invention

The present invention relates to a resin multilayer substrate including a plurality of insulating resin base material layers and a plurality of conductor patterns provided on the plurality of insulating resin base material layers, an electronic component including the resin multilayer substrate, and a mounting structure of the electronic component.

2. Description of the Related Art

Generally, when a resin base material of a multilayer substrate receives heat at a predetermined temperature or higher, a portion of the resin base material is thermally decomposed to generate gas such as $CO_2$ and water. Additionally, oxygen resulting from a reduction reaction of oxidized conductor patterns due to the heat and carbon in the thermoplastic resin undergo an oxidation reaction to generate $CO_2$. Further, elements of the laminate absorb moisture during a manufacturing process thereof. When the multilayer substrate is heated with such a gas and water remaining in the multilayer substrate, the gas or vapor expands to cause delamination. Accordingly, in the formation of the multilayer substrate, heating and pressurization are typically performed under reduced pressure and a predetermined preheating step is provided, which allows the gas to be discharged to the outside of the laminate during the heating and pressurization.

However, when the multilayer substrate has a metal pattern with a large area, the gas cannot pass through the metal pattern. Accordingly, depending on the location where the gas is generated, a gas discharge path to the outside of the multilayer substrate is longer than that in the case where there is no such a metal pattern, and thus the gas may remain in the substrate. Then, the remaining gas may expand due to heating during the manufacture of the multilayer substrate or the mounting of the multilayer substrate on another substrate, and delamination may occur after all.

For example, JP 2005-136347 A discloses a structure in which a metal pattern with a large area includes minute degassing holes penetrating it in a laminating direction. This structure allows gas generated inside during heating of a multilayer substrate to be discharged via the degassing holes through short discharge paths. That is, the amount of the gas remaining in the multilayer substrate is reduced, and delamination during the heating is reduced.

When a signal line, a ground conductor, and an insulating resin base material layer between the signal line and the ground conductor define a high-frequency transmission line in a multilayer substrate, the ground conductor corresponds to the above-described metal pattern with a large area.

However, openings as degassing holes provided in the ground conductor may cause degradation of characteristics of the transmission line. For example, since a shielding property of the ground conductor deteriorates, unnecessary radiation from the transmission line to the outside increases or the transmission line becomes susceptible to noise from the outside. Additionally, since continuity of capacitance generated between the signal line and the ground conductor deteriorates, the characteristic impedance of the transmission line becomes uneven. As a result, return loss and insertion loss increase. Further, when the degassing is insufficient, the outer shape or the outer surface is deformed due to delamination and mountability significantly deteriorates.

SUMMARY OF THE INVENTION

Preferred embodiments of the present invention provide resin multilayer substrates in each of which the problem of delamination due to heating or the like is resolved while degradation of electrical characteristics of a transmission line is significantly reduced or prevented. Preferred embodiments of the present invention also provide electronic components each having enhanced mountability on a circuit substrate or the like by significantly reducing or preventing deformation of the outer shape or the outer surface, and mounting structures of the electronic components.

A resin multilayer substrate according to a preferred embodiment of the present invention includes a plurality of insulating resin base material layers, and a plurality of conductor patterns provided on the plurality of insulating resin base material layers. The plurality of conductor patterns include a signal line and a ground conductor overlapping the signal line as viewed from a laminating direction of the plurality of insulating resin base material layers. A plurality of openings are provided in the ground conductor to provide an unevenly distributed aperture ratio. The openings are provided, in a direction perpendicular or substantially perpendicular to the laminating direction, in a first zone adjacent to or in a vicinity of the signal line and in a second zone farther from the signal line than the first zone and the aperture ratio is higher in the second zone than in the first zone.

The structure is able to increase the total area of the openings provided in the ground conductor while significantly reducing or preventing a change in capacitance generated between the signal line and a portion of the ground conductor adjacent to this signal line. Therefore, degassing during heating is effectively performed while the electrical characteristics of the transmission line are maintained.

The openings may be provided only at positions not overlapping the signal line as viewed from the laminating direction. This structure is able to significantly reduce or prevent a change in capacitance generated between the signal line and a portion of the ground conductor adjacent to the signal line.

A diameter or a width of each of the openings may be smaller than a line width of the signal line. This structure results in a smaller influence of the openings on the electrical characteristics of the transmission line.

The ground conductor may include a plurality of ground conductors between which the signal line is sandwiched in the laminating direction, and the resin multilayer substrate may include an interlayer connecting conductor that electrically connects the ground conductors provided on different layers to each other. According to this structure, since a side of the transmission line is electrically shielded by the interlayer connecting conductor, unnecessary radiation to the side is significantly reduced or prevented and/or the transmission line is hardly affected by noise from the outside. Further, the potentials of the plurality of ground conductors between which the signal line are sandwiched are stabilized, and thus the electrical characteristics of the transmission line are stabilized.

A diameter or a width of each of the openings may be smaller than a diameter or a width of the interlayer connecting conductor. The openings have a degassing effect with the diameter or the width of a certain length or more, and the interlayer connecting conductor has electrical characteristics (decrease in electrical resistance) that are improved as the width thereof increases. Therefore, the above structure is able to improve the electrical characteristics of the interlayer connecting conductors while maintaining the degassing effect.

The interlayer connecting conductor may include a resin component. This facilitates formation of the interlayer connecting conductor, and achieves high bondability between the insulating resin base material layer and the interlayer connecting conductor.

The aperture ratio of the openings may be higher, in the direction perpendicular or substantially perpendicular to the laminating direction, in a zone adjacent to or in a vicinity of the interlayer connecting conductor than in a zone separated away from the interlayer connecting conductor. This structure significantly reduces or prevents the total area of the entire openings, and allows the gas generated from the interlayer connecting conductor to escape efficiently.

The interlayer connecting conductor may be in contact with the insulating resin base material layers via the openings. According to this structure, the gas also escapes from an end of the interlayer connecting conductor in the laminating direction, and thus the degassing is more efficient.

Both sides of the interlayer connecting conductor in the laminating direction may be in contact with the insulating resin base material layers via the openings. According to this structure, the gas generated from the interlayer connecting conductor escapes more efficiently.

The interlayer connecting conductor may be provided over the plurality of insulating resin base material layers and have a portion provided in a zigzag shape in the laminating direction. According to this structure, since the opening amount per unit thickness in the laminating direction increases, the gas generated from the insulating resin base material layers and the interlayer connecting conductor escapes efficiently.

The ground conductor may include a plurality of ground conductors between which the signal line is sandwiched in the laminating direction, and a plating film may be provided to electrically connect the ground conductors provided on different layers to each other. According to this structure, the plating film allows the transmission line to have a shielding property.

When the signal line includes a plurality of signal lines provided on the insulating resin base material layers different from each other, the ground conductor may include an inner-layer ground conductor that is located between the plurality of signal lines in the laminating direction and a surface-layer ground conductor that is located at a surface layer side with respect to the plurality of signal lines, the openings may be provided in the inner-layer ground conductor and the surface-layer ground conductor, and an aperture ratio of the openings provided in the surface-layer ground conductor may be higher than an aperture ratio of the openings provided in the inner-layer ground conductor.

A relatively large amount of gas is generally generated in the surface layer where heat is easily applied from the outside and the temperature is easily increased. Further, the gas generated inside the multilayer substrate tends to be led from the inside toward the surface layer. According to the structure, the gas is able to efficiently escape from the surface layer.

A size of each of the openings provided in the second zone may be larger than a size of each of the openings provided in the first zone.

A number of the openings provided in the second zone may be larger than a number of the openings provided in the first zone.

An electronic component according to a preferred embodiment of the present invention includes a first connecting portion and a second connecting portion to be electrically connected to an external circuit, and a transmission line portion linking the first connecting portion and the second connecting portion. The first connecting portion, the second connecting portion, and the transmission line portion are defined by a resin multilayer substrate. The resin multilayer substrate includes a plurality of insulating resin base material layers, and a plurality of conductor patterns provided on the plurality of insulating resin base material layers. The plurality of conductor patterns include a signal line and a ground conductor overlapping the signal line as viewed from a laminating direction of the plurality of insulating resin base material layers. A plurality of openings are provided in the ground conductor to provide an unevenly distributed aperture ratio. The openings are provided, in a direction perpendicular or substantially perpendicular to the laminating direction, in a first zone adjacent to or in a vicinity of the signal line and in a second zone farther from the signal line than the first zone. The aperture ratio is higher in the second zone than in the first zone.

The above features significantly reduce or prevent deformation of the outer shape or the outer surface due to delamination, and improve mountability of surface-mounting on a circuit substrate, for example.

A mounting structure of an electronic component according to a preferred embodiment of the present invention includes a circuit substrate and an electronic component that is surface-mounted on a circuit substrate. The electronic component includes a first connecting portion and a second connecting portion to be electrically connected to an external circuit, and a transmission line portion linking the first connecting portion and the second connecting portion. The first connecting portion, the second connecting portion, and the transmission line portion are defined by a resin multilayer substrate. The resin multilayer substrate includes a plurality of insulating resin base material layers, and a plurality of conductor patterns provided on the plurality of insulating resin base material layers. The plurality of conductor patterns include a signal line and a ground conductor overlapping the signal line as viewed from a laminating direction of the plurality of insulating resin base material layers. A plurality of openings are provided in the ground conductor to provide an unevenly distributed aperture ratio. The openings are provided, in a direction perpendicular or substantially perpendicular to the laminating direction, in a first zone adjacent to or in a vicinity of the signal line and in a second zone farther from the signal line than the first zone and the aperture ratio is higher in the second zone than in the first zone.

The above features provide the mounting structure in which the electronic component having high flatness is surface-mounted on a circuit substrate.

According to preferred embodiments of the present invention, resin multilayer substrates are provided in each of which the problem of delamination due to heating or the like is resolved while degradation of the electrical characteristics of the transmission line is significantly reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a longitudinal sectional view of a resin multilayer substrate 103 according to a third preferred embodiment of the present invention.

FIG. 13 is a longitudinal sectional view along the line X-X in FIG. 12.

DETAILED DESCRIPTION OF THE PREFERRED EMBODIMENTS

Figure 1A:
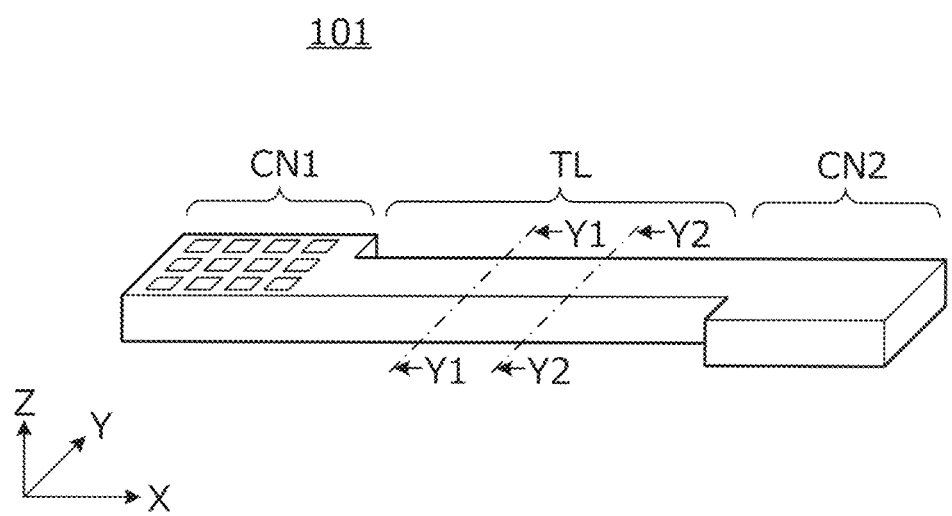
FIG. 1A is an external perspective view of a resin multilayer substrate 101 according to a first preferred embodiment of the present invention.

Hereinafter, preferred embodiments of the present invention will be described in detail with reference to the drawings and some specific examples. In the drawings, the same or similar portions are denoted by the same reference signs. The preferred embodiments are described separately for convenience in consideration of ease of explanation or understanding of main points. However, features shown in different preferred embodiments are able to be partially replaced or combined. In a second preferred embodiment and in subsequent preferred embodiments, description of matters common to a first preferred embodiment will be omitted, and only different points will be described. In particular, similar advantageous effects by similar configurations will not be sequentially described for each preferred embodiment.

First Preferred Embodiment

Figure 1B:
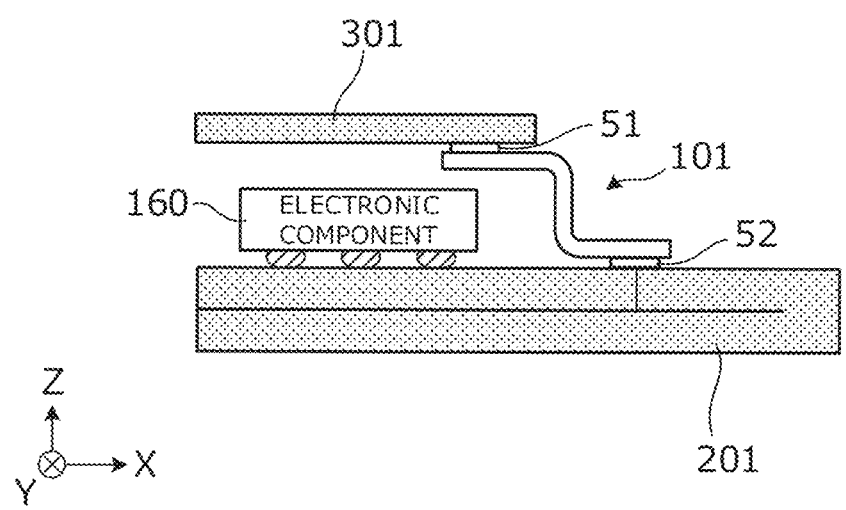
FIG. 1B is a cross-sectional view showing a mounting structure of the resin multilayer substrate 101.

FIG. 1A is an external perspective view of a resin multilayer substrate 101 according to a first preferred embodiment of the present invention. FIG. 1B is a cross-sectional view showing a mounting structure of the resin multilayer substrate 101. In an example shown in FIG. 1B, the resin multilayer substrate 101 is an electronic component implemented as a cable that electrically connects another circuit substrate 201 and a certain component 301. This resin multilayer substrate 101 is also an example of the "electronic component" according to the present invention. The resin multilayer substrate 101 includes a first connecting portion CN1, a second connecting portion CN2, and a transmission line portion TL. Connection electrodes are exposed on an upper surface of the first connecting portion CN1 shown in FIG. 1A and on a lower surface of the second connecting portion CN2 shown in FIG. 1A, respectively. The transmission line portion TL includes a strip-line high-frequency transmission line linking the first connecting portion CN1 and the second connecting portion CN2. This transmission line portion TL may be bent. Further, the first connecting portion CN1 and/or the second connecting portion CN2 may include a connector.

In the example shown in FIG. 1B, the resin multilayer substrate 101 is electrically connected to the component 301 via a connector 51, and electrically connected to a circuit provided on the circuit substrate 201 via a connector 52. In this example, an electronic component 160 is also mounted on the circuit substrate 201. The resin multilayer substrate 101 is structured to avoid the electronic component 160 and not to be unnecessarily coupled to this electronic component.

Figure 2:
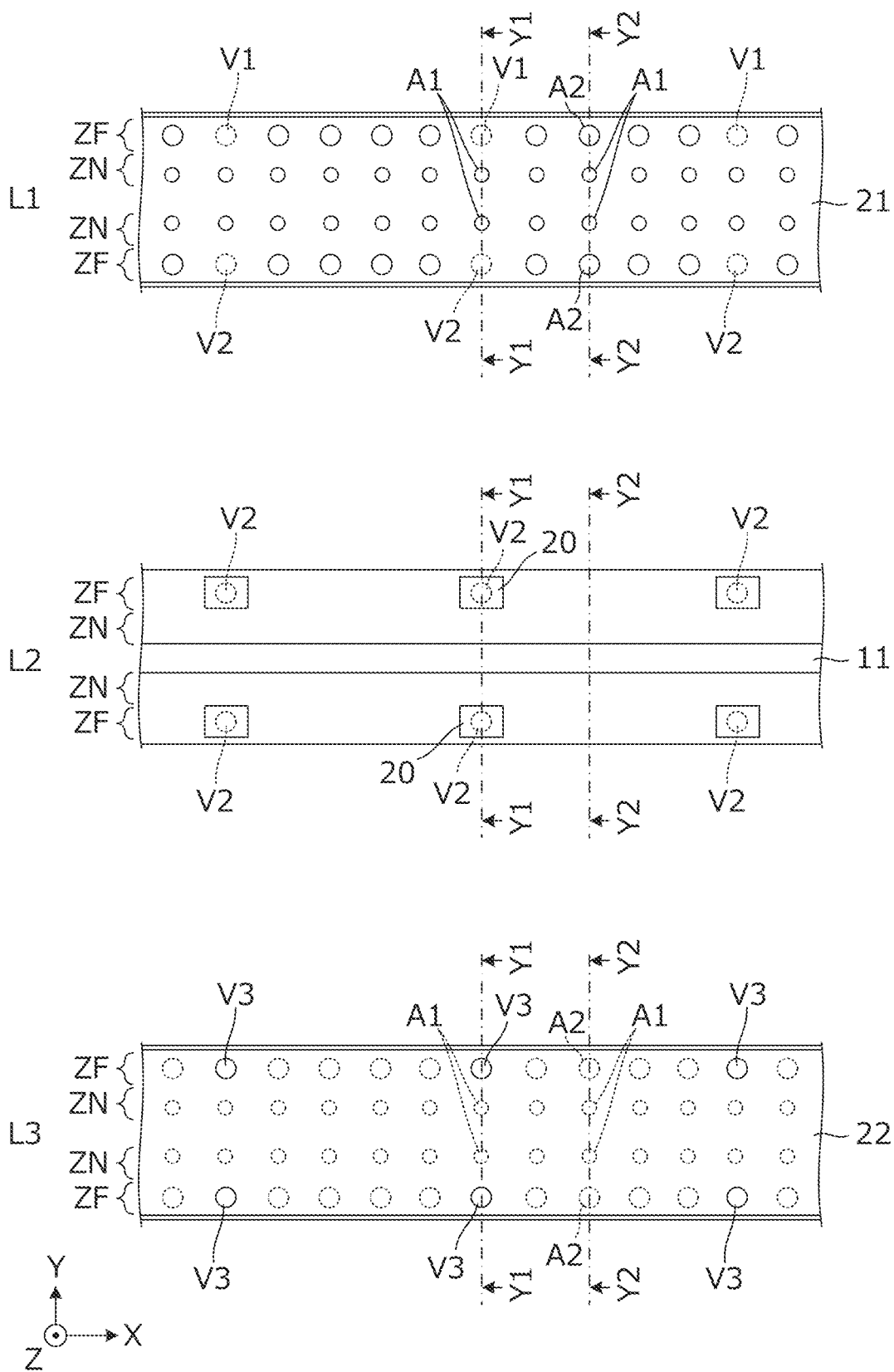
FIG. 2 shows plan views of a plurality of insulating resin base material layers before being laminated that define a main portion of the resin multilayer substrate 101.
Figure 3A:
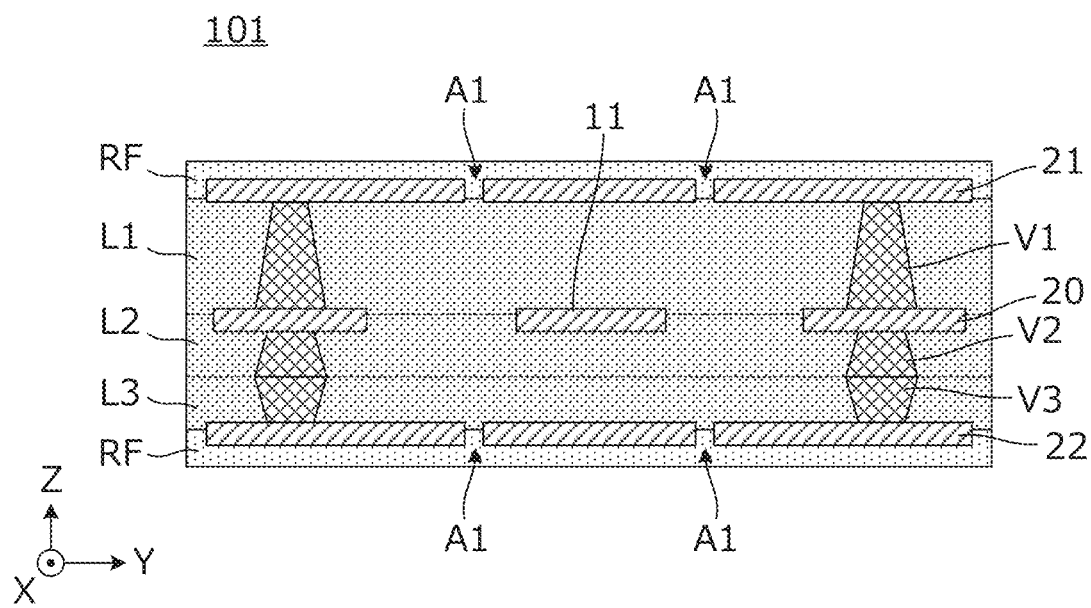
FIG. 3A is a longitudinal sectional view along the line Y1-Y1 in FIGS. 1A and 2.
Figure 3B:
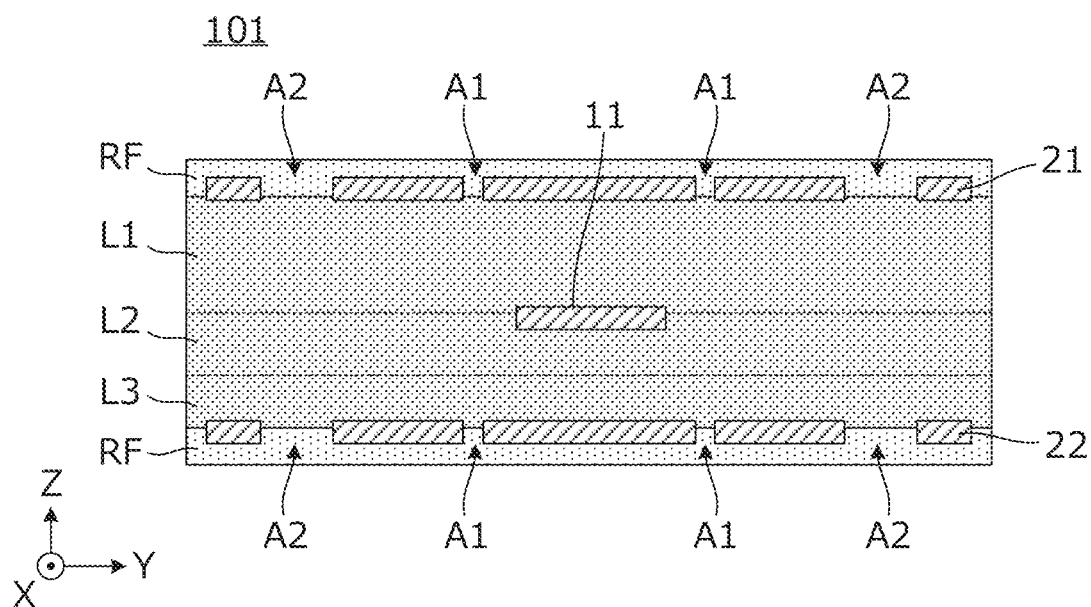
FIG. 3B is a longitudinal sectional view along the line Y2-Y2 in FIGS. 1A and 2.

FIG. 2 shows plan views of a plurality of insulating resin base material layers before being laminated that define a main portion of the resin multilayer substrate 101. In FIG. 2, positions corresponding to the line Y1-Y1 and the line Y2-Y2 are indicated by dash-dot lines. FIG. 3A is a longitudinal sectional view along the line Y1-Y1 in FIGS. 1A and 2, and FIG. 3B is a longitudinal sectional view along the line Y2-Y2 in FIGS. 1A and 2. FIG. 2 shows an individual-piece state for convenience of explanation, but a normal manufacturing process is performed in an aggregate-substrate state.

The resin multilayer substrate 101 includes three insulating resin base material layers L1, L2, L3, resist films RF covering both surfaces of a laminate of the insulating resin base material layers L1, L2, L3, and a plurality of conductor patterns provided on the insulating resin base material layers L1, L2, L3. The conductor patterns include a signal line 11 and ground conductors 21, 22 overlapping the signal line 11 as viewed from the laminating direction of the insulating resin base material layers L1, L2, L3 (direction parallel or substantially parallel to the Z-axis). The signal line 11, the ground conductors 21, 22, and the insulating resin base material layers L1, L2, L3 between the signal line 11 and the ground conductors 21, 22 define a strip-line transmission line.

The insulating resin base material layers L1, L2, L3 are preferably thermoplastic resin base material mainly including of liquid crystal polymer (LCP) or polyether ether ketone (PEEK), for example.

An interlayer connecting conductor V1 connecting the ground conductor 21 and an interlayer connection conductor pattern 20 is provided in the insulating resin base material layer L1. An interlayer connecting conductor V2 electrically connected to the interlayer connection conductor pattern 20 is provided in the insulating resin base material layer L2. An interlayer connecting conductor V3 connecting the ground conductor 22 and the interlayer connecting conductor V2 is provided in the insulating resin base material layer L3. The interlayer connecting conductors V1, V2, V3 are, for example, via conductors provided by providing, in openings that define the interlayer connecting conductors provided in the insulating resin base material layers, conductive paste including metal powder of at least one metal out of Cu and Sn or an alloy thereof and a resin component, and then by solidifying the paste through a heat press treatment in a lamination process.

The ground conductors 21, 22 and the signal line 11 are provided by, for example, patterning Cu foil by photolithography, the Cu foil being attached to the insulating resin base material layers.

According to the above structure, since a side of the transmission line is electrically shielded by the interlayer connecting conductors V1, V2, V3, unnecessary radiation to the side is significantly reduced or prevented and/or the transmission line is hardly affected by noise from the outside. Further, the potentials of the plurality of ground conductors between which the signal line are sandwiched are stabilized, and thus the electrical characteristics of the transmission line are stabilized.

A plurality of openings A1, A2 are provided in the ground conductors 21, 22. According to a distribution of the openings A1, A2, the aperture ratio is higher in a zone ZF far from the signal line 11 than in a zone ZN adjacent to or in a vicinity of the signal line 11 in a direction perpendicular or substantially perpendicular to the laminating direction (X-Y plane direction). In the example shown in FIG. 2, as viewed in a direction parallel or substantially parallel to the Z-axis (in plan view), the small-diameter openings A1 are provided at positions adjacent to the signal line 11, and the large-diameter openings A2 are provided in the zone ZF far from the signal line 11.

In FIG. 2, the openings A1 are aligned at a substantially constant pitch in a direction parallel or substantially parallel to the X-axis. The openings A1 are located at an equal or a substantially equal distance in a direction parallel or substantially parallel to the Y-axis. The openings A2 are also aligned at a substantially constant pitch in the direction parallel or substantially parallel to the X-axis, and the openings A2 are located at an equal or a substantially equal distance in a direction parallel or substantially parallel to the Y-axis.

Thus, it is preferable that the openings A1, A2 are periodically and regularly aligned, for example. As a result, the distribution of the openings is less biased, and the degassing effect is likely to be uniform in the plane direction. That is, since no gas remains locally, an effect of significantly reducing or preventing delamination is improved. The alignment pitch of the openings A1 in the X-axis direction may be different from the alignment pitch of the openings A2 in the X-axis direction. Further, the openings A1 and the openings A2 do not have to be aligned in the direction parallel or substantially parallel to the Y-axis. The openings do not have to be aligned in a straight line in the direction parallel or substantially parallel to the X-axis or in the direction parallel or substantially parallel to the Y-axis, and may be provided in zigzag.

That is, according to a distribution of the plurality of openings A1, A2 in the ground conductors 21, 22, the aperture ratio is higher in the zone ZF far from the signal line 11 in the in-plane direction than in the zone ZN adjacent to or in a vicinity of the signal line 11 in the in-plane direction.

The structure is able to increase the total area of the openings provided in the ground conductors 21, 22 while significantly reducing or preventing a change in capacitance generated between the signal line 11 and portions of the ground conductors 21, 22 adjacent to this signal line 11. Therefore, degassing during heating is effectively performed while the electrical characteristics of the transmission line are maintained. Accordingly, delamination is less likely to occur during heating in manufacturing and/or use phases of the resin multilayer substrate, and deterioration of the electrical characteristics, for example, a characteristic impedance change of the transmission line due to delamination, is able to be significantly reduced or prevented. Moreover, the problems due to the existence of the openings that unnecessary radiation from the transmission line to the outside increases and/or that the transmission line is susceptible to noise from the outside are able to be avoided. Further, the continuity of the capacitance generated between the signal line and the ground conductors does not deteriorate, and the evenness of the characteristic impedance of the transmission line is maintained. Furthermore, since unevenness and curvature of the surface of the resin multilayer substrate due to delamination are eliminated or reduced, the mountability of the resin multilayer substrate is improved. In particular, when there is a bent portion, delamination is likely to occur due to stress applied to the bent portion. Therefore, the above structure is also effective for the resin multilayer substrate having such a bent portion.

The openings A1, A2 are provided at positions not overlapping the signal line 11 as viewed from the laminating direction. Therefore, a change in capacitance generated between the signal line 11 and the portions of the ground conductors 21, 22 adjacent to the signal line 11 is able to be significantly reduced or prevented, and continuity of the characteristic impedance of the transmission line is able to be maintained. In this example, all of the openings A1, A2 are provided only at positions not overlapping the signal line 11 as viewed from the laminating direction. However, a portion of the openings A1, A2 may overlap the signal line 11. This is because, when an overlapping amount is small, the above-described capacitance change is inconsequential.

The diameters of the openings A1 are preferably, for example, about 30 μm to about 70 μm, and the diameters of the openings A2 are preferably, for example, about 50 μm to about 90 μm. The line width of the signal line 11 is preferably, for example, about 100 μm to about 140 μm. The diameters of the openings A1, A2 are smaller than the line width of the signal line 11. This structure results in a small influence of the openings A1, A2 on the electrical characteristics of the transmission line. In particular, the smaller the diameter of the openings A1 provided in the zone adjacent to or in a vicinity of the signal line 11 is, the smaller the influence on the electrical characteristics of the transmission line is.

The diameters of the interlayer connecting conductors V1, V2, V3 are preferably, for example, about 80 μm to about 100 μm. That is, the diameters of the openings A1, A2 are smaller than the diameters of the interlayer connecting conductors V1, V2, V3. The openings have a degassing effect with a diameter of a certain length or more, and the interlayer connecting conductors have electrical characteristics (decrease in electrical resistance) that are improved as the width thereof increases. Therefore, the above structure is able to improve the electrical characteristics of the interlayer connecting conductors while maintaining the degassing effect.

As described above, the interlayer connecting conductors are made of the conductive paste having a resin component before heating and thus are simultaneously provided in a step of laminating and hot-pressing the plurality of insulating resin base material layers L1, L2, L3. That is, the interlayer connecting conductors are easily provided. In addition, since the conductive paste has a resin component, high bondability is able to be obtained between the insulating resin base material layers and the interlayer connecting conductors. The resin component of the conductive paste is preferably, for example, the same or similar kind as the resin component of the insulating resin base material layers.

The resist film RF is provided by printing after formation of the laminate by laminating and hot-pressing the insulating resin base material layers L1, L2, L3. Instead of the resist film RF, a coverlay film may be laminated and hot-pressed together with the insulating resin base material layers L1, L2, L3. The resist film RF is preferably epoxy resin, for example. The epoxy resin has higher gas permeability than the LCP or the PEEK that is the material of the insulating resin base material layers. Therefore, the existence of the resist film RF hardly impairs the gas permeability.

Second Preferred Embodiment

In a second preferred embodiment of the present invention, an example is shown in which the aperture ratio adjacent to or in a vicinity of an interlayer connecting conductor is increased.

An external perspective view of a resin multilayer substrate according to the second preferred embodiment is the same as or similar to that shown in FIG. 1A.

Figure 4:
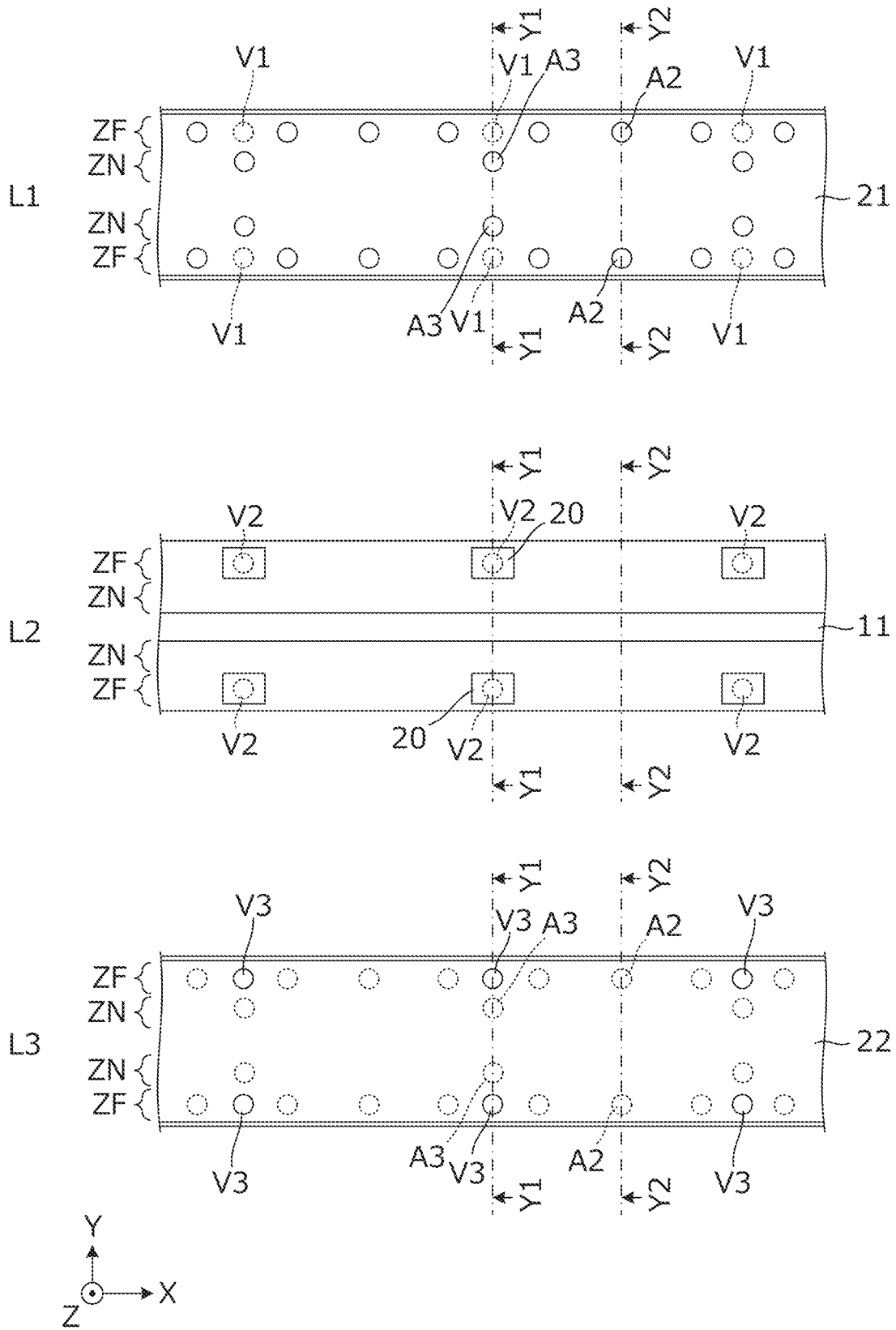
FIG. 4 shows plan views of a plurality of insulating resin base material layers before being laminated that define a main portion of a resin multilayer substrate 102 according to a second preferred embodiment of the present invention.
Figure 5A:
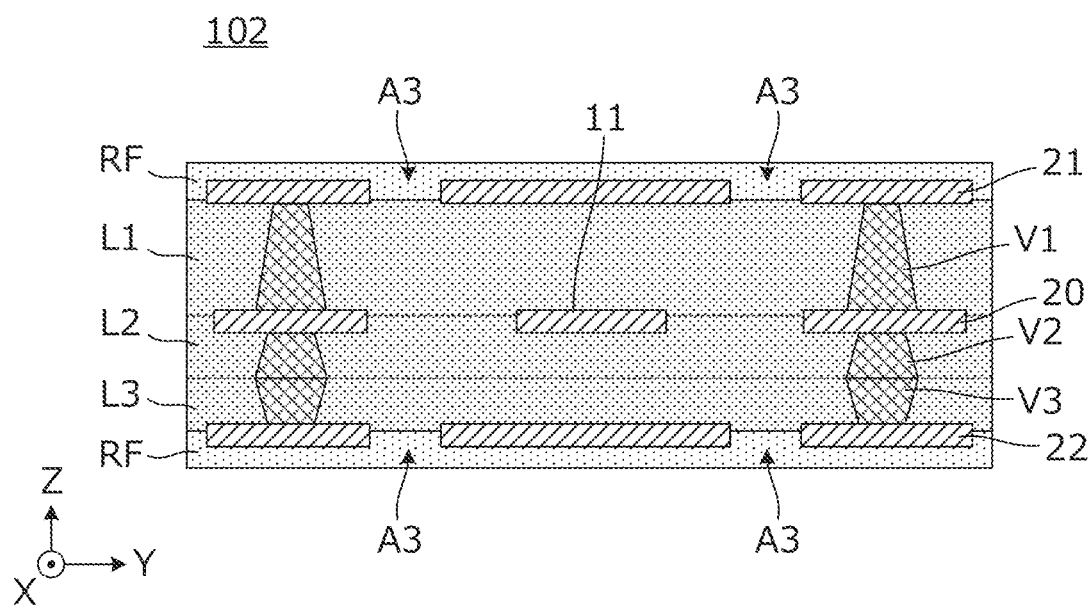
FIG. 5A is a longitudinal sectional view along the line Y1-Y1 in FIG. 4.
Figure 5B:
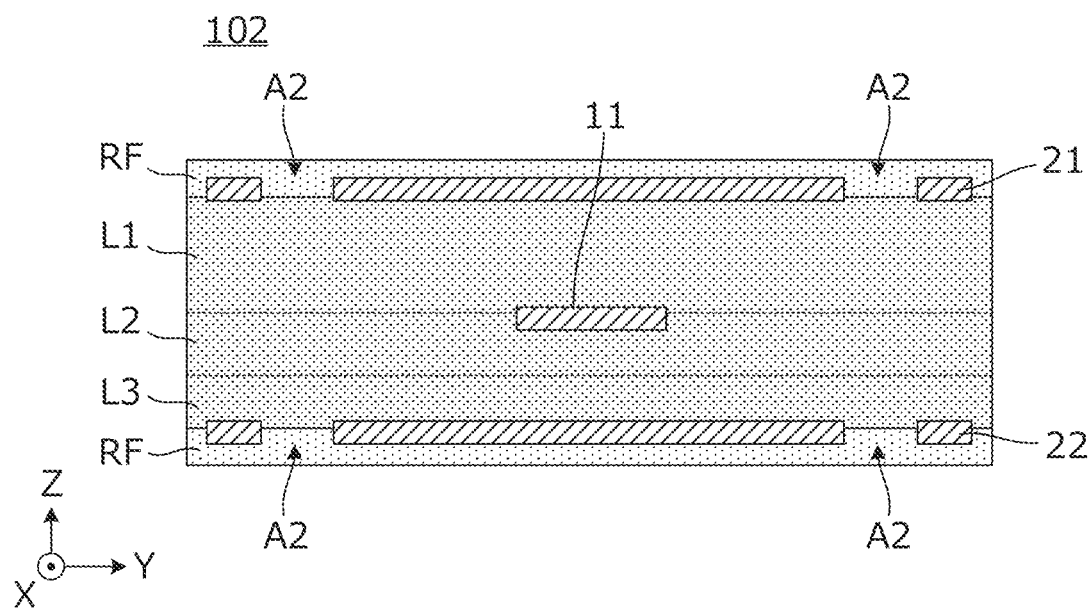
FIG. 5B is a longitudinal sectional view along the line Y2-Y2 in FIG. 4.

FIG. 4 shows plan views of a plurality of insulating resin base material layers before being laminated that define a main portion of a resin multilayer substrate 102 according to the second preferred embodiment. FIG. 5A is a longitudinal sectional view along the line Y1-Y1 in FIG. 4, and FIG. 5B is a longitudinal sectional view along the line Y2-Y2 in FIG. 4.

A plurality of openings A2, A3 are provided in ground conductors 21, 22. According to a distribution of the openings A2, A3, the aperture ratio is higher in a zone ZF far from the signal line 11 than in a zone ZN adjacent to or in a vicinity of the signal line 11 in a direction perpendicular or substantially perpendicular to the laminating direction (X-Y plane direction). Further according to a distribution of the plurality of openings A2, A3, the aperture ratio is higher in a zone adjacent to or in a vicinity of the interlayer connecting conductor than in a zone separated away from the interlayer connecting conductor in the direction perpendicular or substantially perpendicular to the laminating direction. In the example shown in FIG. 4, the openings A2, A3 surround three sides of the interlayer connecting conductors V1, V2, V3 in plan view.

According to the second preferred embodiment, the gas generated from the interlayer connecting conductors V1, V2, V3 efficiently escapes from the openings A2, A3 while the total area of the openings is restricted.

Third Preferred Embodiment

In a third preferred embodiment of the present invention, an example is shown in which an interlayer connecting conductor is in contact with an insulating resin base material layer via an opening provided in a ground conductor.

FIG. 6 is a longitudinal sectional view of a resin multilayer substrate 103 according to the third preferred embodiment. The resin multilayer substrate 103 includes insulating resin base material layers L1, L2, L3, L4, L5, resist films RF covering both surfaces of a laminate of the insulating resin base material layers L1, L2, L3, L4, L5, and a plurality of conductor patterns provided on the insulating resin base material layers L1, L2, L3, L4, L5. The conductor patterns include a signal line 11 and ground conductors 21, 22 overlapping the signal line 11 as viewed from the laminating direction of the insulating resin base material layers (direction parallel or substantially parallel to the Z-axis). The signal line 11, the ground conductors 21, 22, and the insulating resin base material layers L1, L2, L3, L4, L5 between the signal line 11 and the ground conductors 21, 22 define a strip-line transmission line.

An interlayer connecting conductor V11 connecting the ground conductor 21 and an interlayer connection conductor pattern 211 is provided in the insulating resin base material layer L1. An interlayer connecting conductor V12 connecting the interlayer connection conductor pattern 211 and an interlayer connection conductor pattern 212 is provided in the insulating resin base material layer L2. An interlayer connecting conductor V13 connecting the interlayer connection conductor pattern 212 and an interlayer connection conductor pattern 20 is provided in the insulating resin base material layer L3. An interlayer connecting conductor V2 electrically connected to the interlayer connection conductor pattern 20 is provided in the insulating resin base material layer L4. An interlayer connecting conductor V3 connecting the ground conductor 22 and the interlayer connecting conductor V2 is provided in the insulating resin base material layer L5.

Unlike the resin multilayer substrate shown in the first preferred embodiment, openings A4 that allow the interlayer connecting conductors to contact with the insulating resin base material layers are provided in the ground conductors 21, 22 and the interlayer connection conductor patterns 211, 212, 20.

Figure 7:
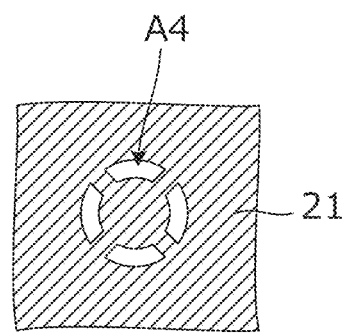
FIG. 7 is a partial plan view showing a shape of an opening A4 provided in a ground conductor 21.

FIG. 7 is a partial plan view showing the shape of the opening A4 provided in the ground conductor 21. The opening A4 is a group of a plurality of arc-shaped openings and has a ring shape as a whole. The upper end of the interlayer connecting conductor V11 is exposed from the ring-shaped opening A4. Thus, the interlayer connecting conductor exposed from the opening A4 contacts with the resist film RF. The lower end of the interlayer connecting conductor V11 is exposed from another opening A4 to contact with the insulating resin base material layer L2. Similarly, the upper end of the interlayer connecting conductor V12 is exposed from another opening A4 to contact with the insulating resin base material layer L1. The lower end of the interlayer connecting conductor V12 is exposed from another opening A4 to contact with the insulating resin base material layer L3. The upper end of the interlayer connecting conductor V13 is exposed from another opening A4 to contact with the insulating resin base material layer L2. The lower end of the interlayer connecting conductor V13 is exposed from another opening A4 to contact with the insulating resin base material layer L4. The upper end of the interlayer connecting conductor V2 is exposed from another opening A4 to contact with the insulating resin base material layer L3. Further, the lower end of the interlayer connecting conductor V3 is exposed from another opening A4 to contact with the resist film RF.

According to such a structure, the gas also escapes from the ends of the interlayer connecting conductors V11, V12, V13, V2, V3 in the laminating direction, and thus degassing is more efficient.

As shown in FIG. 6, it is preferable, for example, to provide the opening A4 at each contact position between the interlayer connecting conductor and the conductor pattern for all the interlayer connecting conductors. However, even when the openings A4 are provided at a portion of the positions, the degassing effect is improved.

The interlayer connecting conductors V11, V12, V13 are provided over the insulating resin base material layers L1, L2, L3, and are provided in a zigzag shape in the laminating direction. According to such a structure, since an opening amount (total opening area) per unit thickness in the laminating direction increases, the gas generated from the insulating resin base material layers and the interlayer connecting conductors escapes efficiently.

Fourth Preferred Embodiment

In a fourth preferred embodiment of the present invention, an example of a resin multilayer substrate 104 including a plurality of signal lines is shown.

Figure 8:
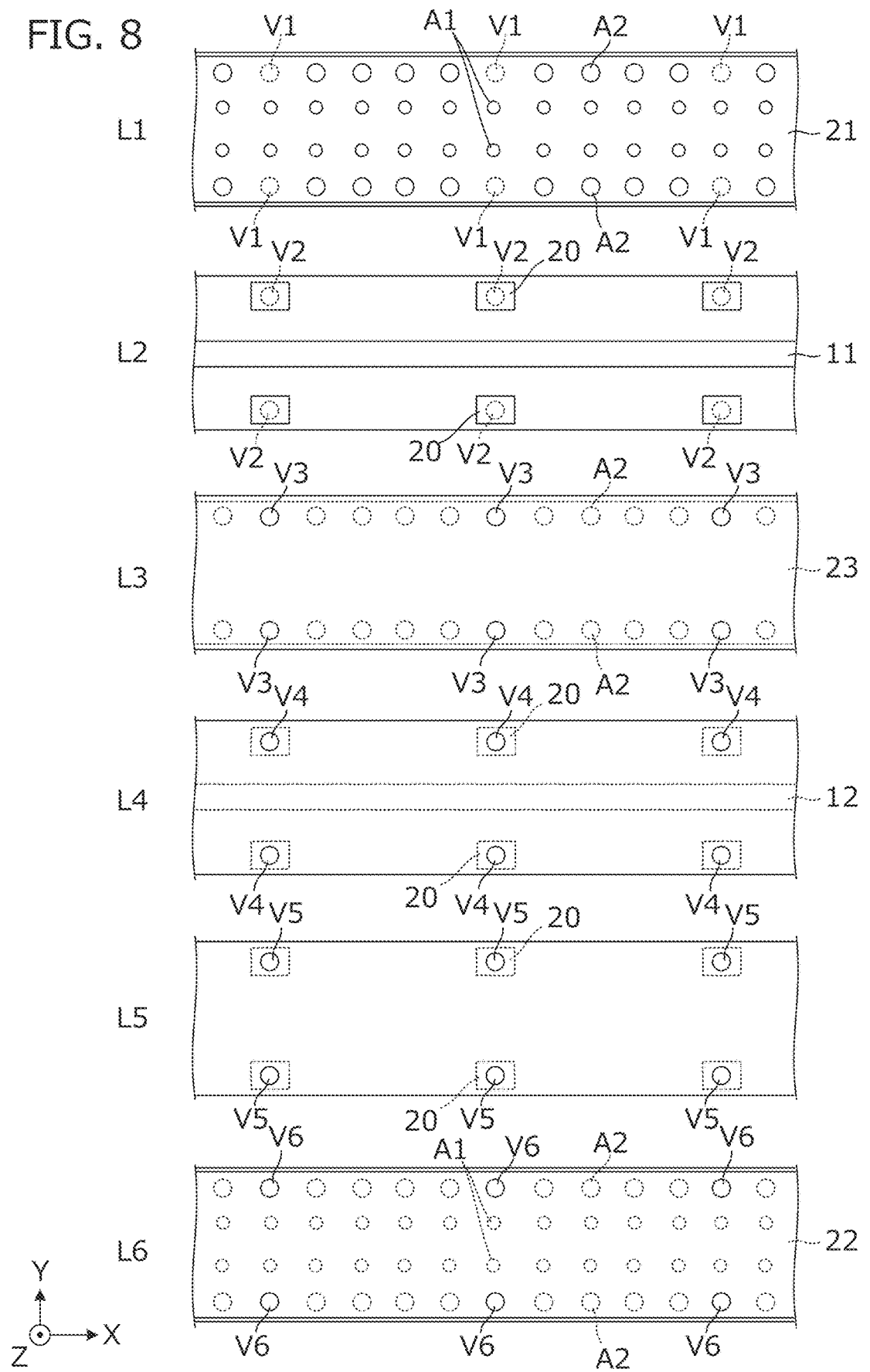
FIG. 8 shows plan views of a plurality of insulating resin base material layers before being laminated that define a main portion of a resin multilayer substrate 104.
Figure 9A:
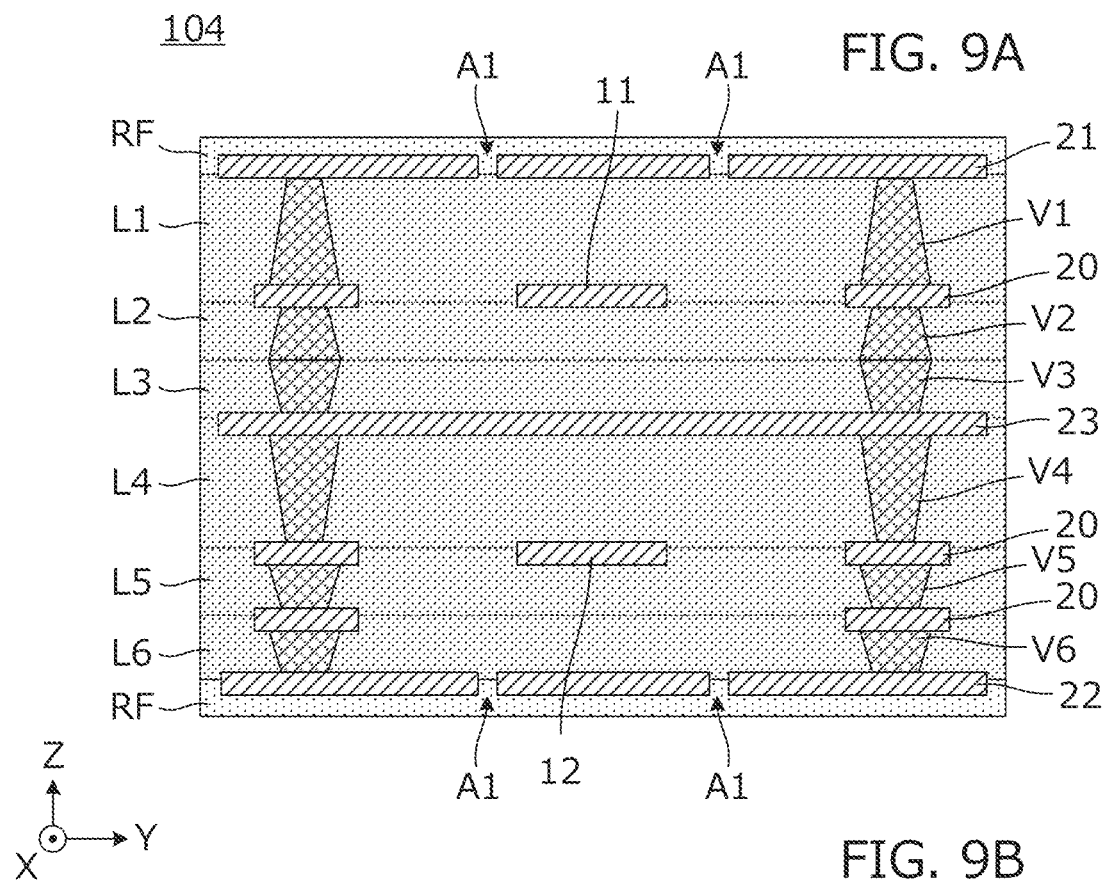
FIG. 9A is a longitudinal sectional view of the main portion of the resin multilayer substrate 104.
Figure 9B:
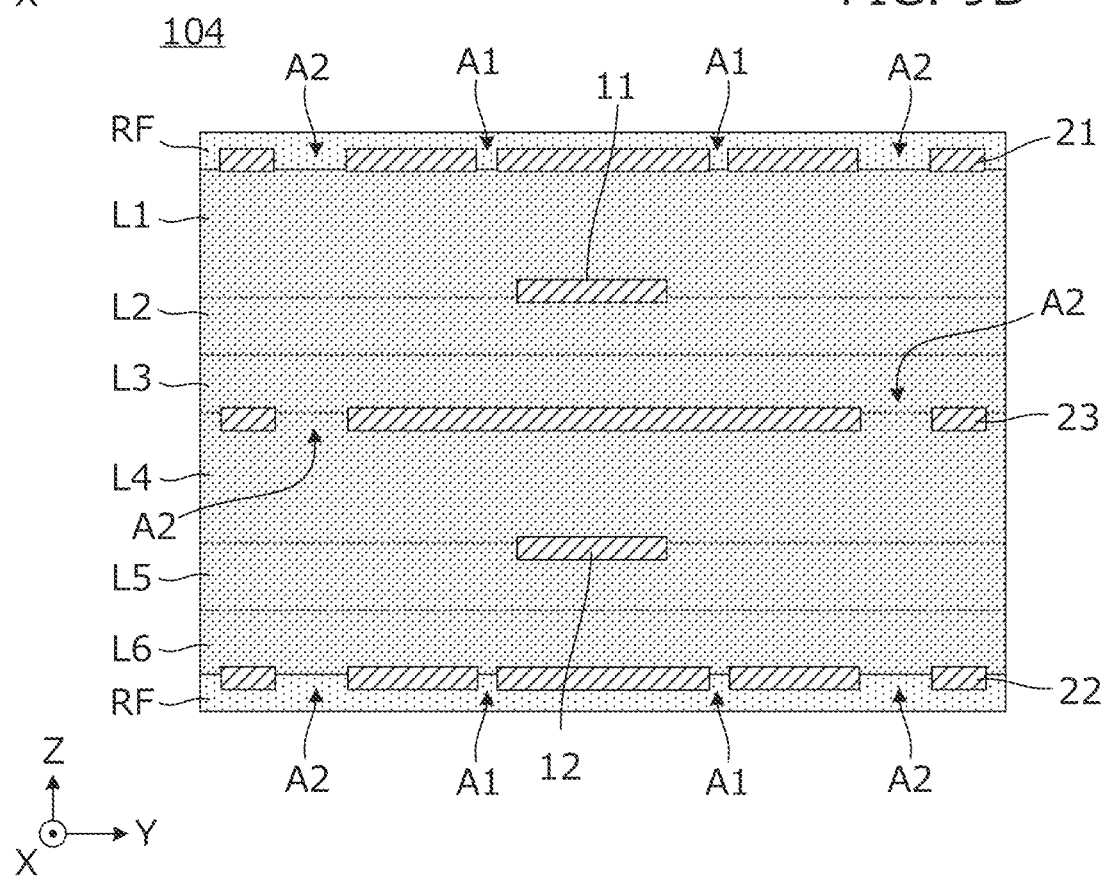
FIG. 9B is a longitudinal sectional view of the main portion of the resin multilayer substrate 104.

FIG. 8 shows plan views of a plurality of insulating resin base material layers before being laminated that define a main portion of the resin multilayer substrate 104. FIGS. 9A and 9B are longitudinal sectional views of the main portion of the resin multilayer substrate 104. FIG. 9A is a longitudinal sectional view along a plane passing through interlayer connecting conductors V1, V2, V3, V4, V5, V6 shown in FIG. 8. FIG. 9B is a longitudinal sectional view along a plane passing through small-diameter openings A1 and large-diameter openings A2 shown in FIG. 8.

The resin multilayer substrate 104 includes insulating resin base material layers L1, L2, L3, L4, L5, L6, resist films RF covering both surfaces of a laminate of the insulating resin base material layers, and a plurality of conductor patterns provided on the insulating resin base material layers. The conductor patterns include signal lines 11, 12 and ground conductors 21, 22, 23 overlapping the signal lines 11, 12 as viewed from the laminating direction of the insulating resin base material layers (direction parallel or substantially parallel to the Z-axis). The signal lines 11, 12, the ground conductors 21, 22, 23, and the insulating resin base material layers L1, L2, L3, L4, L5, L6 between the signal lines 11, 12 and the ground conductors 21, 22, 23 define two strip-line transmission lines.

The openings A1, A2 are provided in the ground conductors 21, 22, 23 as in the first preferred embodiment, and the distribution of the openings is the same as or similar to that shown in the first preferred embodiment.

The ground conductors 21, 22 correspond to the "surface-layer ground conductors", and the ground conductor 23 corresponds to the "inner-layer ground conductor". As shown in the fourth preferred embodiment, when the plurality of signal lines are provided on the insulating resin base material layers different from each other, not only the surface-layer ground conductors 21, 22 but also the inner-layer ground conductor 23 is provided with the openings A2.

However, the aperture ratio of the openings A1, A2 provided in the surface-layer ground conductors 21, 22 is higher than the aperture ratio of the opening A2 provided in the inner-layer ground conductor 23.

A relatively large amount of gas is generated in the surface layer where heat is easily applied from the outside and the temperature is easily increased. Further, the gas generated inside the multilayer substrate tends to be led from the inside toward the surface layer. Therefore, the structure allows the gas to efficiently escape from the surface layer while significantly reducing or preventing the total area of the openings provided in the ground conductors.

Further, according to the fourth preferred embodiment, since the aperture ratio of the inner-layer ground conductor 23 is relatively small, high isolation between the two transmission lines is able to be maintained.

Fifth Preferred Embodiment

In a fifth preferred embodiment of the present invention, a resin multilayer substrate 105 including an interlayer connecting conductor defined by a plating film is shown.

Figure 10:
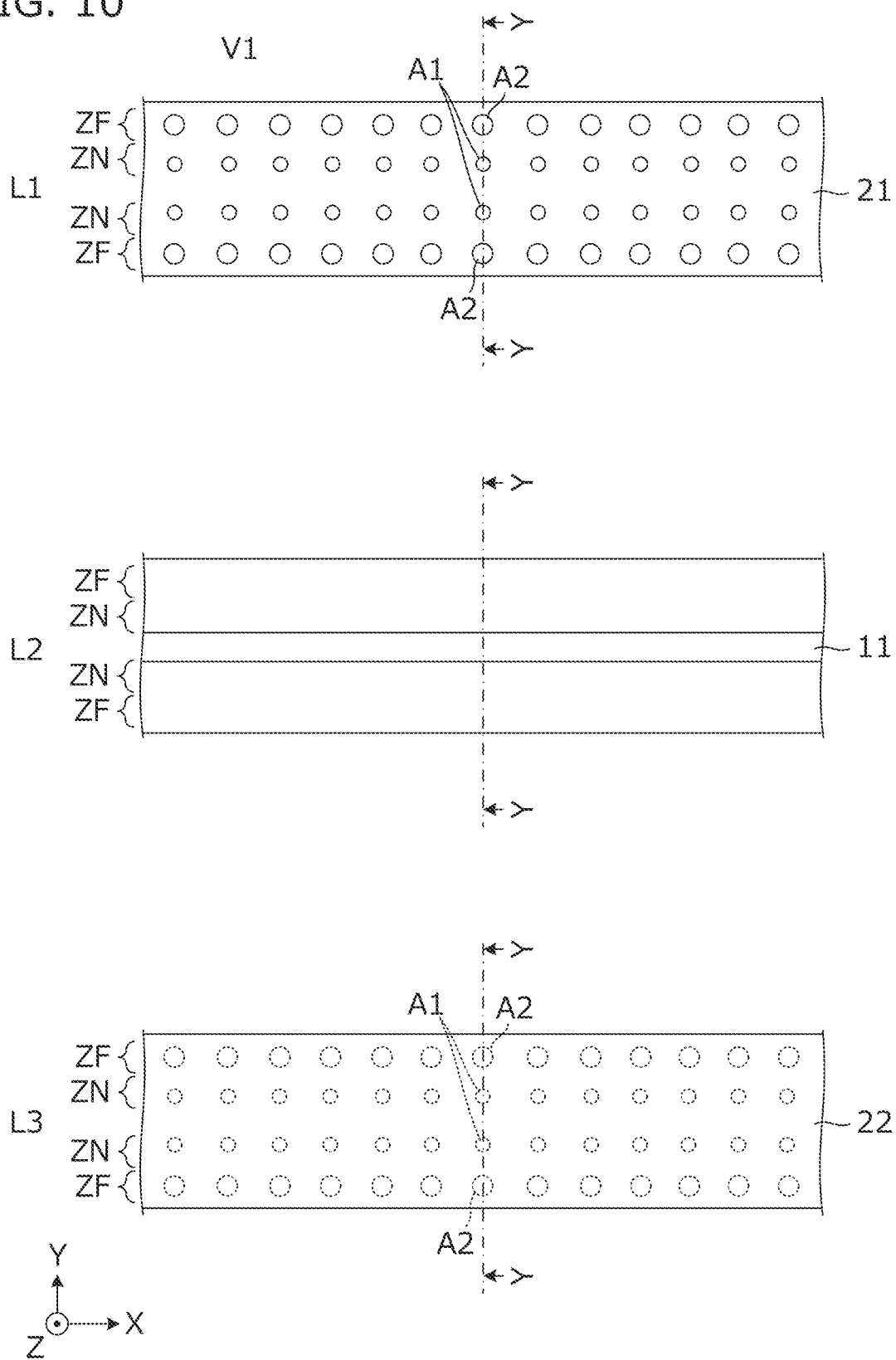
FIG. 10 shows plan views of a plurality of insulating resin base material layers before being laminated that define a main portion of a resin multilayer substrate 105.
Figure 11:
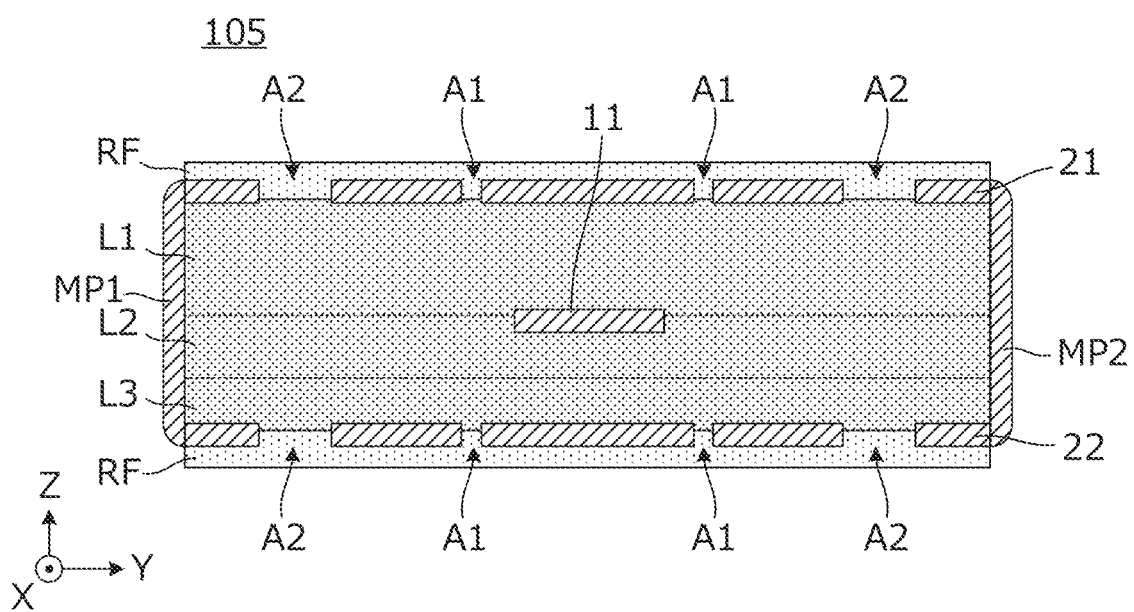
FIG. 11 is a longitudinal sectional view of the resin multilayer substrate 105 along the line Y-Y in FIG. 10.

FIG. 10 shows plan views of a plurality of insulating resin base material layers before being laminated that define a main portion of the resin multilayer substrate 105. FIG. 11 is a longitudinal sectional view of the resin multilayer substrate 105 along the line Y-Y in FIG. 10.

The resin multilayer substrate 105 includes three insulating resin base material layers L1, L2, L3, resist films RF covering both surfaces of a laminate of the insulating resin base material layers L1, L2, L3, and a plurality of conductor patterns provided on the insulating resin base material layers L1, L2, L3. The conductor patterns include a signal line 11 and ground conductors 21, 22 overlapping the signal line 11 as viewed from the laminating direction of the insulating resin base material layers L1, L2, L3 (direction parallel or substantially parallel to the Z-axis). The signal line 11, the ground conductors 21, 22, and the insulating resin base material layers L1, L2, L3 between the signal line 11 and the ground conductors 21, 22 define a strip-line transmission line.

Plating films MP1, MP2 are provided on side surfaces of the laminate of the insulating resin base material layers L1, L2, L3. The plating films MP1, MP2 electrically connect the ground conductors 21, 22 to each other. The plating films MP1, MP2 are preferably formed by, for example, a Cu electroless plating method.

According to the fifth preferred embodiment, the plating films MP1, MP2 allow the transmission lines to have a shielding property. When the side surfaces of the laminate are thus covered with the plating films MP1, MP2, the gas is likely to be confined. However, since the openings A1, A2 are provided in the ground conductors 21, 22, the gas is easily released to the outside of the laminate. In particular, since the aperture ratio in a zone separated away from the signal line 11 in plan view is high, the gas in a vicinity of the side surface of the laminate is effectively released.

The interlayer connecting conductor defined by the plating film is not limited to what is provided on the side surface of the laminate of the insulating resin base material layers L1, L2, L3. The interlayer connecting conductor may be provided by through-hole plating or filled-via plating for connection of the plurality of ground conductors through the laminate. Using the interlayer connecting conductor provided by through-hole plating or filled-via plating results in reduced gas generation as compared with a case of using the interlayer connecting conductor including a resin component. However, since the interlayer connecting conductor provided by through-hole plating or filled-via plating has low gas permeability, it is preferable, for example, to form openings adjacent to or in a vicinity of the interlayer connecting conductor in plan view.

Sixth Preferred Embodiment

Figure 12:
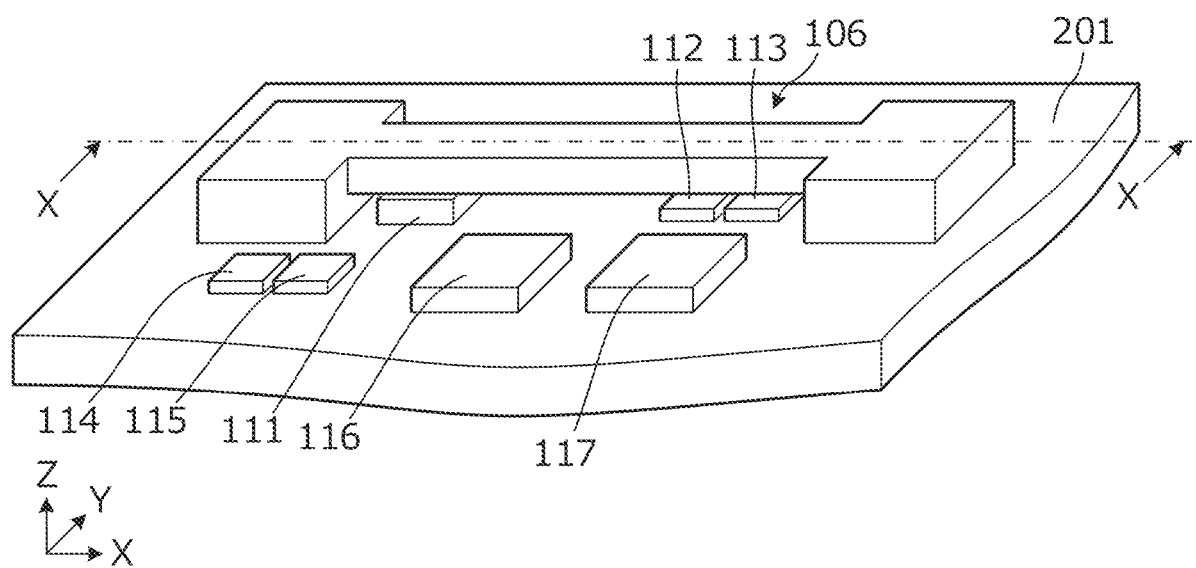
FIG. 12 is a perspective view showing a mounting structure of an electronic component according to a sixth preferred embodiment of the present invention.

In a sixth preferred embodiment of the present invention, a mounting structure of an electronic component is shown. FIG. 12 is a perspective view showing the mounting structure of the electronic component according to the sixth preferred embodiment. FIG. 13 is a longitudinal sectional view along the line X-X in FIG. 12. A resin multilayer substrate 106 of the sixth preferred embodiment is a resin multilayer substrate as an electronic component that is surface-mounted on a circuit substrate 201, the electronic component working as a flat cable.

As shown in FIGS. 12 and 13, the mounting structure of the electronic component of the sixth preferred embodiment includes the circuit substrate 201, and the resin multilayer substrate 106 and electronic components 111 to 117 that are mounted on the circuit substrate 201. The resin multilayer substrate 106 includes a laminate including a plurality of insulating resin base material layers, a transmission line portion TL, a first connecting portion CN1 linked to a first portion of the transmission line portion TL, and a second connecting portion CN2 linked to a second portion of the transmission line portion TL. The transmission line portion TL and the first and second connecting portions CN1, CN2 are provided in the laminate.

The resin multilayer substrate 106 has a longitudinal direction, which is directed to X-axis direction in FIGS. 12 and 13, and the first connecting portion CN1 and the second connecting portion CN2 are provided at both ends of the resin multilayer substrate 106 in the longitudinal direction.

As shown in FIG. 13, the circuit substrate 201 includes circuit-substrate-side connecting portions CN11, CN12 to which the first connecting portion CN1 and the second connecting portion CN2 of the resin multilayer substrate 106 are respectively connected. A resist film 9 is also provided on the circuit substrate 201.

As shown in FIG. 12, the electronic components 111, 112, 113 are located between the transmission line portion TL of the resin multilayer substrate 106 and the circuit substrate 201 in a state where the resin multilayer substrate 106 is mounted on the circuit substrate 201.

The first connecting portion CN1 of the resin multilayer substrate 106 is electrically connected to a pad electrode provided on the circuit-substrate-side first connecting portion CN11 of the circuit substrate 201 via solder SO. Similarly, the second connecting portion CN2 of the resin multilayer substrate 106 is electrically connected to a pad electrode provided on the circuit-substrate-side second connecting portion CN12 of the circuit substrate 201 via solder SO. The solder SO is solder that is pre-coated before mounting, or a solder ball.

The insulating resin base material layers of the resin multilayer substrate 106 have a lower permittivity and a lower dielectric loss than an insulator portion of the circuit substrate 201. For example, the relative permittivity of the insulator portion of the circuit substrate 201 is preferably about 4, while the relative permittivity of the insulating resin base material layers of the resin multilayer substrate 106 is preferably about 3.

Like the other electronic components 111 to 117, the resin multilayer substrate 106 is sucked by a vacuum suction head, mounted on the circuit substrate, and then surface-mounted on the circuit substrate 201 in a reflow soldering step.

Since the cross-sectional surface shown in FIG. 13 is a plane passing through a signal line, openings provided in ground conductors are not shown. However, conductor patterns provided on the respective insulating resin base material layers are the same as or similar to those shown in FIG. 2 and the like. Accordingly, the resin multilayer substrate 106 of the sixth preferred embodiment has less deformation (expansion or foam-shaped projection) of the outer shape or the outer surface due to delamination and ensures flatness. Therefore, even such a long resin multilayer substrate (electronic component) is able to be surface-mounted.

Other Preferred Embodiments

In each of the preferred embodiments described above, the example is shown in which the circular openings are provided in the ground conductors. However, the shape of the openings is not limited to a circle. The shape may be a rectangle, a rounded rectangle, an oval, an ellipse, or the like, for example. The cross-sectional shape of the interlayer connecting conductor may include a similar shape.

In some preferred embodiments described above, the example is shown in which a plurality of kinds of openings different in diameter are distributed to determine the aperture ratio. However, the aperture ratio may be determined by the distribution density of the openings. For example, even when the openings provided in the signal-line-adjacent zone ZN and the openings provided in the signal-line-separated zone ZF have the same or substantially the same diameter, the aperture ratio in the signal-line-separated zone ZF may be increased by making the alignment pitch of the openings provided in the signal-line-separated zone ZF narrower than the alignment pitch of the openings provided in the signal-line-adjacent zone ZN. FIG. 4 is also an example of that.

In the example shown in FIGS. 1A and 1B, the electronic component used as a cable that connects two members to each other is configured. However, an electronic component that is mounted in whole on a circuit substrate or a resin multilayer substrate that alone defines a predetermined circuit may be similarly configured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a plurality of insulating resin base material layers; and
   a plurality of conductor patterns provided on the plurality of insulating resin base material layers; wherein
   the plurality of conductor patterns include a signal line and a ground conductor overlapping the signal line as viewed from a laminating direction of the plurality of insulating resin base material layers;
   a plurality of openings are provided in the ground conductor to provide an unevenly distributed aperture ratio;
   the plurality of openings extend through only the ground conductor, and no conductor extends from a periphery of any of the plurality of openings in the laminating direction; and
   the openings are provided, in a direction perpendicular or substantially perpendicular to the laminating direction, in a first zone adjacent to or in a vicinity of the signal line and in a second zone farther from the signal line than the first zone, and the aperture ratio is higher in the second zone than in the first zone.

2. The resin multilayer substrate according to claim 1, wherein the openings are provided only at positions not overlapping the signal line as viewed from the laminating direction.

3. The resin multilayer substrate according to claim 1, wherein a diameter or a width of each of the openings is smaller than a line width of the signal line.

4. The resin multilayer substrate according to claim 1, wherein the ground conductor includes a plurality of ground conductors between which the signal line is sandwiched in the laminating direction, the resin multilayer substrate including an interlayer connecting conductor that electrically connects the ground conductors provided on different layers to each other.

5. The resin multilayer substrate according to claim 4, wherein a diameter or a width of each of the openings is smaller than a diameter or a width of the interlayer connecting conductor.

6. The resin multilayer substrate according to claim 4, wherein the interlayer connecting conductor includes a resin component.

7. The resin multilayer substrate according to claim 4, wherein the aperture ratio of the openings is higher, in the direction perpendicular or substantially perpendicular to the laminating direction, in a zone adjacent to or in a vicinity of the interlayer connecting conductor than in a zone separated away from the interlayer connecting conductor.

8. The resin multilayer substrate according to claim 1, wherein the ground conductor includes a plurality of ground conductors between which the signal line is sandwiched in the laminating direction, and a plating film is provided to electrically connect the ground conductors provided on different layers to each other.

9. The resin multilayer substrate according to claim 1, wherein
the signal line includes a plurality of signal lines provided on the insulating resin base material layers different from each other;
the ground conductor includes an inner-layer ground conductor that is located between the plurality of signal lines in the laminating direction and a surface-layer ground conductor that is located at a surface layer side with respect to the plurality of signal lines;
the openings are provided in the inner-layer ground conductor and the surface-layer ground conductor; and
an aperture ratio of the openings provided in the surface-layer ground conductor is higher than an aperture ratio of the openings provided in the inner-layer ground conductor.

10. The resin multilayer substrate according to claim 1, wherein a size of each of the openings provided in the second zone is larger than a size of each of the openings provided in the first zone.

11. The resin multilayer substrate according to claim 1, wherein a number of the openings provided in the second zone is larger than a number of the openings provided in the first zone.

12. The resin multilayer substrate according to claim 1, wherein, in the laminating direction, a resist film covers an outermost surface of the plurality of insulating base material layers.

13. The resin multilayer substrate according to claim 1, wherein
the plurality of insulating resin base material layers include a first resin base material layer and a second resin base material layer;
the signal line is provided between the first resin base material layer and the second resin base material layer; and
the ground conductor is provided on an exterior surface of the first resin base material layer.

14. The resin multilayer substrate according to claim 13, further comprising a second ground conductor provided on an exterior surface of the second resin base material layer.

15. An electronic component comprising:
a first connecting portion and a second connecting portion to be electrically connected to an external circuit; and
a transmission line portion linking the first connecting portion and the second connecting portion; wherein
the first connecting portion, the second connecting portion, and the transmission line portion are defined by a resin multilayer substrate, the resin multilayer substrate including:
a plurality of insulating resin base material layers; and
a plurality of conductor patterns provided on the plurality of insulating resin base material layers; wherein
the plurality of conductor patterns include a signal line and a ground conductor overlapping the signal line as viewed from a laminating direction of the plurality of insulating resin base material layers;
a plurality of openings are provided in the ground conductor to provide an unevenly distributed aperture ratio;
the plurality of openings extend through only the ground conductor, and no conductor extends from a periphery of any of the plurality of openings in the laminating direction; and
the openings are provided, in a direction perpendicular or substantially perpendicular to the laminating direction, in a first zone adjacent to or in a vicinity of the signal line and in a second zone farther from the signal line than the first zone, and the aperture ratio is higher in the second zone than in the first zone.

16. A mounting structure of an electronic component, comprising:
a circuit substrate; and
an electronic component that is surface-mounted on the circuit substrate, the electronic component including:
a first connecting portion and a second connecting portion to be electrically connected to an external circuit; and
a transmission line portion linking the first connecting portion and the second connecting portion; wherein
the first connecting portion, the second connecting portion, and the transmission line portion are defined by a resin multilayer substrate, the resin multilayer substrate including:
a plurality of insulating resin base material layers; and
a plurality of conductor patterns provided on the plurality of insulating resin base material layers; wherein
the plurality of conductor patterns include a signal line and a ground conductor overlapping the signal line as viewed from a laminating direction of the plurality of insulating resin base material layers;

a plurality of openings are provided in the ground conductor to provide an unevenly distributed aperture ratio;

the plurality of openings extend through only the ground conductor, and no conductor extends from a periphery of any of the plurality of openings in the laminating direction; and the openings are provided, in a direction perpendicular or substantially perpendicular to the laminating direction, in a first zone adjacent to or in a vicinity of the signal line and in a second zone farther from the signal line than the first zone, and the aperture ratio is higher in the second zone than in the first zone.

* * * * *